(12) United States Patent
Peng et al.

(10) Patent No.: US 9,093,528 B2
(45) Date of Patent: Jul. 28, 2015

(54) STRESS COMPENSATION LAYER TO IMPROVE DEVICE UNIFORMITY

(71) Applicant: Taiwan Semiconductor Manufacturing Co., Ltd., Hsin-Chu (TW)

(72) Inventors: Yen-Ming Peng, Zhongli (TW); Chen-Chung Lai, Guanxi Township (TW); Kang-Min Kuo, Zhubei (TW); Bor-Zen Tien, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 133 days.

(21) Appl. No.: 13/905,438

(22) Filed: May 30, 2013

(65) Prior Publication Data

US 2014/0353833 A1    Dec. 4, 2014

(51) Int. Cl.
  *H01L 29/78*     (2006.01)
  *H01L 23/00*     (2006.01)
  *H01L 23/498*    (2006.01)
  *H01L 21/8234*   (2006.01)

(52) U.S. Cl.
  CPC ...... *H01L 29/7843* (2013.01); *H01L 21/82345* (2013.01); *H01L 23/49811* (2013.01); *H01L 23/562* (2013.01)

(58) Field of Classification Search
  CPC ............ H01L 29/7842; H01L 29/7843; H01L 21/76829; H01L 21/823475; H01L 23/52; H01L 23/522; H01L 21/76801; H01L 21/82345
  USPC .................. 438/618, 622; 257/758, E23.141, 257/E23.142, E21.575
  See application file for complete search history.

(56) References Cited

U.S. PATENT DOCUMENTS

| | | | |
|---|---|---|---|
| 6,372,661 B1* | 4/2002 | Lin et al. ............... | 438/769 |
| 2003/0070451 A1* | 4/2003 | Ouellet et al. ................ | 65/386 |
| 2003/0199159 A1* | 10/2003 | Fan et al. .................... | 438/612 |
| 2004/0137647 A1* | 7/2004 | Miyazaki et al. ................ | 438/3 |
| 2005/0029663 A1* | 2/2005 | Farrar ............................ | 257/758 |
| 2005/0122265 A1* | 6/2005 | Gaucher et al. ........ | 343/700 MS |
| 2006/0226545 A1* | 10/2006 | Suminoe et al. ............. | 257/738 |
| 2009/0051026 A1* | 2/2009 | Chey et al. ................... | 257/712 |
| 2011/0049723 A1* | 3/2011 | Fayaz et al. .................. | 257/773 |
| 2011/0175137 A1* | 7/2011 | Utumi ........................... | 257/100 |
| 2013/0062775 A1* | 3/2013 | Ryan ............................. | 257/774 |
| 2013/0161795 A1* | 6/2013 | Owada ......................... | 257/620 |
| 2013/0168740 A1* | 7/2013 | Chen ............................ | 257/254 |
| 2014/0008798 A1* | 1/2014 | Baba et al. ................... | 257/738 |
| 2014/0104030 A1* | 4/2014 | Li et al. ........................ | 336/220 |

* cited by examiner

*Primary Examiner* — Joseph C Nicely
(74) *Attorney, Agent, or Firm* — Eschweiler & Associates, LLC (57) ABSTRACT

The present disclosure relates to an integrated chip having one or more back-end-of-the-line (BEOL) stress compensation layers that reduce stress on one or more underlying semiconductor devices, and an associated method of formation. In some embodiments, the integrated chip has a semiconductor substrate with one or more semiconductor devices. A stressed element is located within a back-end-of-the-line stack at a position overlying the one or more semiconductor devices. A stressing layer is located over the stressed element induces a stress upon the stressed element. A stress compensation layer, located over the stressed element, provides a counter-stress to reduce the stress induced on the stressed element by the stressing layer. By reducing the stress induced on the stressed element, stress on the semiconductor substrate is reduced, improving uniformity of performance of the one or more semiconductor devices.

20 Claims, 5 Drawing Sheets

STRESS COMPENSATION LAYER TO IMPROVE DEVICE UNIFORMITY

BACKGROUND

Modern day integrated chips comprise millions or billions of semiconductor devices that are formed within a semiconductor body (e.g., a silicon wafer). The semiconductor devices are vertically connected to a back-end-of-the-line metallization stack comprising a plurality of overlying metal interconnect wires. The plurality of metal interconnect wires electrically connect the semiconductor devices to each other and to external components.

The plurality of metal interconnect wires increase in size as the distance from the semiconductor devices increases. Often the metal interconnect wires terminate at a bond pad located at a top of the back-end-of-the-line metallization stack. The bond pad may comprise a thick layer of metal that provides a conductive connection from the integrated chip to external components. For example, a metal wire may be configured to contact the bond pad to connect the bond pad to external leads of a package.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

The present disclosure relates to an integrated chip having one or more back-end-of-the-line (BEOL) stress compensation layers configured to reduce stress on one or more underlying semiconductor devices, and an associated method of formation. In some embodiments, the integrated chip comprises a semiconductor substrate comprising one or more semiconductor devices. A stressed element is located within a back-end-of-the-line stack at a position overlying the one or more semiconductor devices. A stressing layer is located over the stressed element is configured to induce a stress upon the stressed element. A stress compensation layer, located over the stressed element, is configured to provide a counter-stress configured to reduce the stress induced on the stressed element by the stressing layer. By reducing the stress induced on the stressed element, stress on the semiconductor substrate is reduced, improving uniformity of performance of the one or more semiconductor devices.

Figure 1A:
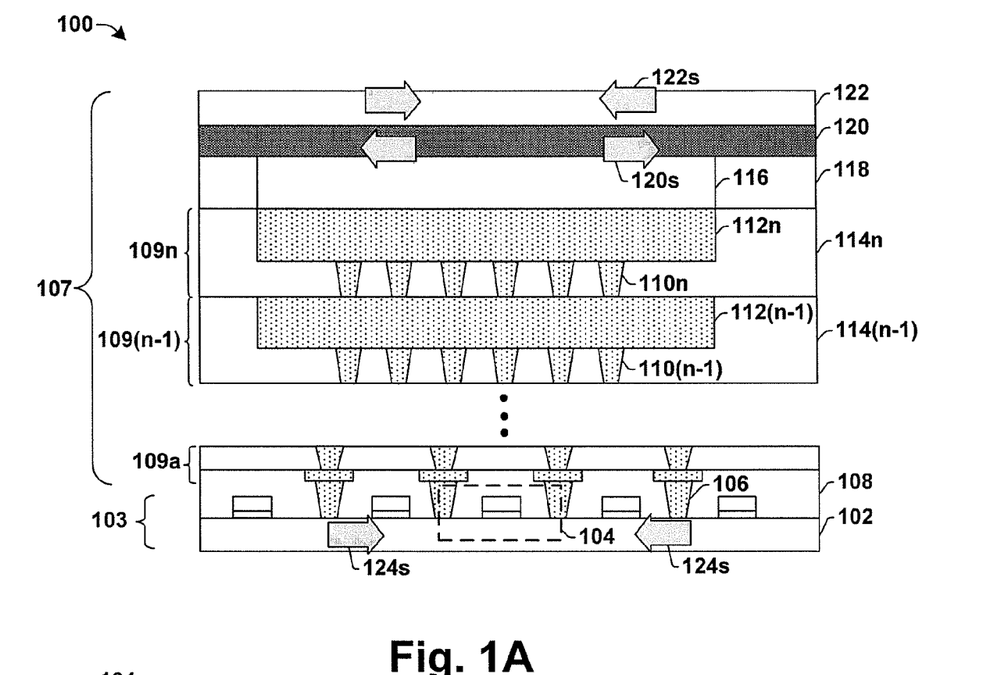
FIGS. 1A-1B illustrate some embodiments of cross-sectional views of an integrated chip comprising a back-end-of-the-line stress compensation layer.

FIG. 1A illustrates a block diagram of some embodiments of an integrated chip 100 comprising a back-end-of-the-line stress compensation layer 120 configured to improve performance of one or more underlying semiconductor devices 104.

The integrated chip 100 comprises a semiconductor substrate 102 (e.g., a silicon substrate, a silicon germanium substrate, etc.). One or more semiconductor devices 104 are disposed within a front-end-of-the-line (FEOL) 103 of the integrated chip 100. In some embodiments, shown in FIG. 1B, the one or more semiconductor devices 104 comprise MOSFET (metal-oxide-silicon field effect transistor) devices having a source region and a drain region separated by a channel 126. A gate region, overlying the channel 126 and configured to control the flow of charge carriers between the source region and the drain region, comprises a gate material 130 (e.g., aluminum, polysilicon, etc.) disposed above a gate insulating layer 128. The gate region may comprise a single finger gate (as shown) or a multiple finger gate, in various embodiments.

Metal contacts 106 are disposed within a dielectric layer 108 disposed onto the semiconductor substrate 102. The metal contacts 106 are configured to connect the one more semiconductor devices 104 to a back-end-of-the-line (BEOL) metallization stack 107 comprising a plurality of metal interconnect layers 109a, . . . , 109n. Respective metal interconnect layers 109 may comprise metal contacts 110 (i.e., vias) and metal interconnect wires 112 disposed within a dielectric material 114. The plurality of metal interconnect layers 109a, . . . , 109n are configured to provide signals to and/or from the one or more semiconductor devices 104.

A stressed element 116 is disposed within a dielectric material 118 in the BEOL metallization stack 107 at a position vertically overlying the one or more semiconductor devices 104. In some embodiments, the stressed element 116 may comprise a wire bond pad and/or a redistribution layer configured to perform a routing function (i.e., to route signals to different locations on the integrated chip 100). In other embodiments, the stressed element 116 may comprise other back-end-of-the-line structure, such as a dielectric film, for example. Although the stressed element 116 is illustrated as having a top surface aligned with the dielectric material 118 it will be appreciated that at least a portion of the stressed element 116 may be protrude from dielectric material 118.

A stressing layer 122 is located at a position over the stressed element 116. The stressing layer 122 is configured to apply a stress 122s upon the stressed element 116. For example, the stressing layer 122 may apply a stress 122s comprising a compressive stress (as shown) or a tensile film onto the stressed element 116. In various embodiments, the stressing layer 122 may comprise a passivation layer such as a silicon nitride (SIN) layer or an undoped silicate glass (USG) layer.

Figure 1B:
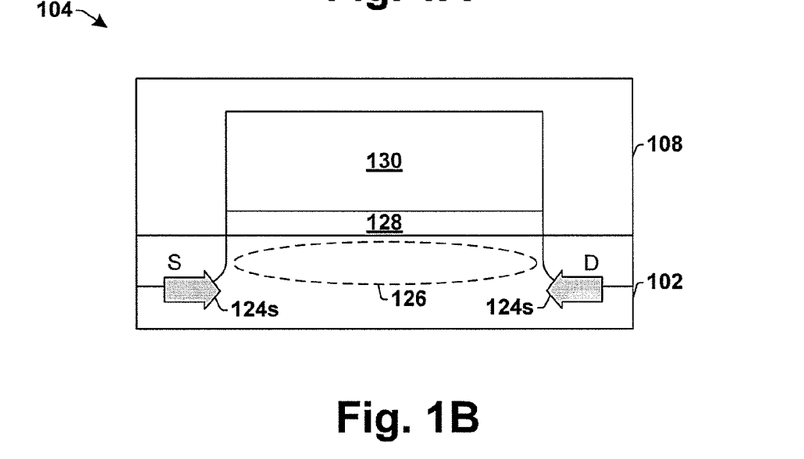

The stress 122s applied to stressed element 116 propagates through the BEOL metallization stack 107 to the one or more semiconductor devices 104 located below the stressed element 116. For example, as shown in FIG. 1B, the stress 122s on stressed element 116 may be transferred by metal interconnect layers 109a-109n to a dielectric layer 108 surrounding the gate structure. The stress 122s acts on the semiconductor substrate 102 to induce a compressive channel stress 124s in the channel region between the source region and the drain region. The compressive channel stress 124s may cause the one or more semiconductor devices 104 to suffer from stress induced mobility shift within the channel 126 of the devices. The stress induced mobility shift causes non-uniformities in the performance of the one or more semiconductor devices (e.g., non-uniformity in saturation current, $I_{sat}$).

A stress compensation layer 120, located within the BEOL metallization stack 107, is disposed over the stressed element 116. The stress compensation layer 120 configured to provide a counter-stress 120s that reduces the stress 122s induced on the stressed element 116 by the stressing layer 122. By reducing the stress 122s on the stressed element 116, device performance uniformity of the one or more semiconductor devices 104 is improved. In some embodiments, the stress compensation layer 120 may comprise a dielectric film configured to provide a compressive or tensile stress. For example, the stress compensation layer 120 may comprise nitride layer comprising nitrogen, an oxide layer comprising oxygen, or an oxynitride layer comprising oxygen and nitrogen. In some embodiments, the stress compensation layer 120 may further comprise a dopant, such as boride, which is introduced into the stress compensation layer 120 during formation.

The stress compensation layer 120 may be located at any position over the stressed element 116. For example, in some embodiments, the stress compensation layer 120 may be disposed between the stressed element 116 and the stressing layer 122. In other embodiments, the stress compensation layer 120 may be disposed onto the stressing layer 122 at a position that is over the stressed element 116.

By adding a stress compensation layer 120 to a position above a stressed element 116 within the BEOL metallization stack 107, stress is reduced on the one or more semiconductor devices 104 within the front-end-of-the-line 103, thereby reducing stress induced mobility shift in the channel 126 and improving uniformity of performance of the one or more semiconductor devices 104.

Figure 2:
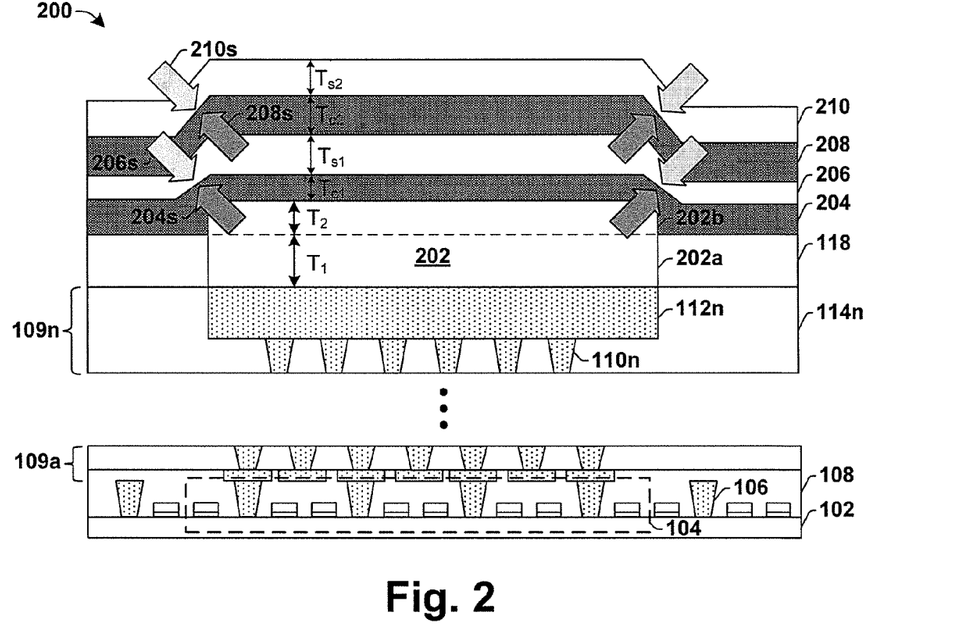
FIG. 2 illustrates some embodiments of a cross sectional view of an integrated chip having multiple stress compensation layers configured to reduce stress on a protruding stressed element.

FIG. 2 illustrates a block diagram of some embodiments of an integrated chip 200 having multiple stress compensation layers 204, 208 configured to reduce stress on a protruding stressed element 202.

The integrated chip 200 comprises one or more semiconductor devices 104 disposed within a semiconductor substrate 102 and connected to a back-end-of-the-line stack comprising a plurality of metal interconnect layers 109a, . . . , 109n. The one or more metal interconnect layers 109a, . . . , 109n are connected to a protruding stressed element 202 that extends outward as a positive relief from a surrounding dielectric material 118.

The protruding stressed element 202 comprises a first portion 202a disposed within the surrounding dielectric material 118, and a second portion 202b that protrudes from the surrounding dielectric material 118. The protrusion of the protruding stressed element 202 from the dielectric material 118 increases the stress on the protruding stressed element 202 provided by overlying stressing layers (e.g., 206, 210). In some embodiments, the first portion 202a of the protruding stressed element 202 has a height $T_1$ and the second portion 202b of the protruding stressed element 202 has a height T2, wherein the ratio of the heights ($T_2/T_1$) is in a range of between approximately 0 and approximately 3.

A first stress compensation layer 204 is disposed onto protruding stressed element 202. The first stress compensation layer 204 has a thickness of $T_{c1}$. A first stressing layer 206 is disposed onto the first stress compensation layer 204. The first stressing layer 206 has a thickness of $T_{s1}$. In some embodiments, a ratio of the thicknesses of the first stress compensation layer 204 and the first stressing layer 206 ($T_{c1}/T_{s1}$) is in a range of between approximately 0.01 and approximately 2.

The first stressing layer 206 is configured to apply a first stress 206s to the protruding stressed element 202. The first stress 206s may comprise a stress having a value in a range of between approximately −5 megapascals (MPa) of compressive stress and approximately −400 MPa of compressive stress. The compressive stress acts inward upon the stressed element 202, as shown by the illustrated arrows of the first stress 206s. The first stress compensation layer 204 is configured to generate a first counter stress 204s that reduces the first stress 206s generated by the first stressing layer 206. The first counter stress 204s may comprise a stress having a value in a range of between approximately 500 MPa of tensile stress and approximately 500 MPa of compressive stress.

A second stress compensation layer 208 is disposed onto first stressing layer 206. The second stress compensation layer 208 has a thickness of $T_{c2}$. A second stressing layer 210 is disposed onto the second stress compensation layer 208. The second stressing layer 210 has a thickness of $T_{s2}$. In some embodiments, a ratio of the thicknesses of the second stress compensation layer 208 and the second stressing layer 210 ($T_{c2}/T_{s2}$) is in a range of between approximately 0.01 and approximately 2. In some embodiments, a ratio of the thicknesses of the second stressing layer 210 and the first stressing layer 206 ($T_{s2}/T_{s1}$) is less than 1 (i.e., the first stressing layer 206 is thicker than the second stressing layer 210).

The second stressing layer 210 is configured to apply a second stress 210s to the protruding stressed element 202. The second stress 210s may comprise a value in a range of between approximately −300 MPa of tensile stress and approximately 500 MPa of compressive stress. The second stress compensation layer 208 is configured to generate a second counter stress 208s that reduces the second stress 210s generated by the second stressing layer 210. The second counter-stress 208s may have a value in a range of between approximately 500 MPa of tensile stress and approximately 500 MPa of compressive stress.

Figure 3:
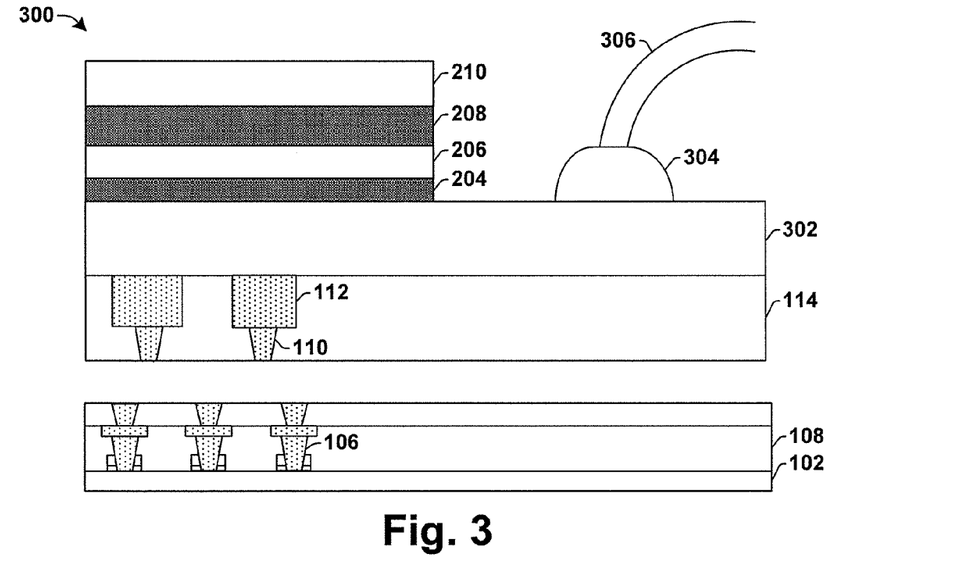
FIG. 3 illustrates some embodiments of an alternative cross sectional view of an integrated chip having multiple stress compensation layers configured to reduce stress on a wire bond/redistribution layer.

FIG. 3 illustrates some embodiments of a block diagram showing an alternative cross sectional view of an integrated chip 300 having multiple stress compensation layers 204,208 configured to reduce stress on a stressed element comprising a wire bond pad/redistribution layer 302.

The integrated chip 300 comprises one or more semiconductor devices 104 disposed within a semiconductor substrate 102 and connected to a back-end-of-the-line metallization stack comprising a plurality of metal interconnect layers 109a, . . . , 109n. The one or more metal interconnect layers 109a, . . . , 109n are configured to terminate at a stressed element comprising a wire bonding pad/redistribution layer 302.

The wire bond pad/redistribution layer 302 is configured to provide for an electrical connection between the semiconductor devices 104 and external leads. The stress compensation layers 204,208 are located over the wire bond pad/redistribution layer 302. The stress compensation layers 204,208 are configured to leave an exposed surface to which a bonding wire 306 is connected by way of a solder ball 304. In various embodiments, the wire bond pad/redistribution layer 302 may comprise aluminum, copper, or a combination thereof. In some embodiments, the wire bond pad/redistribution layer 302 may be further configured to perform routing between one or more metal interconnect layers 109.

Figure 4A:
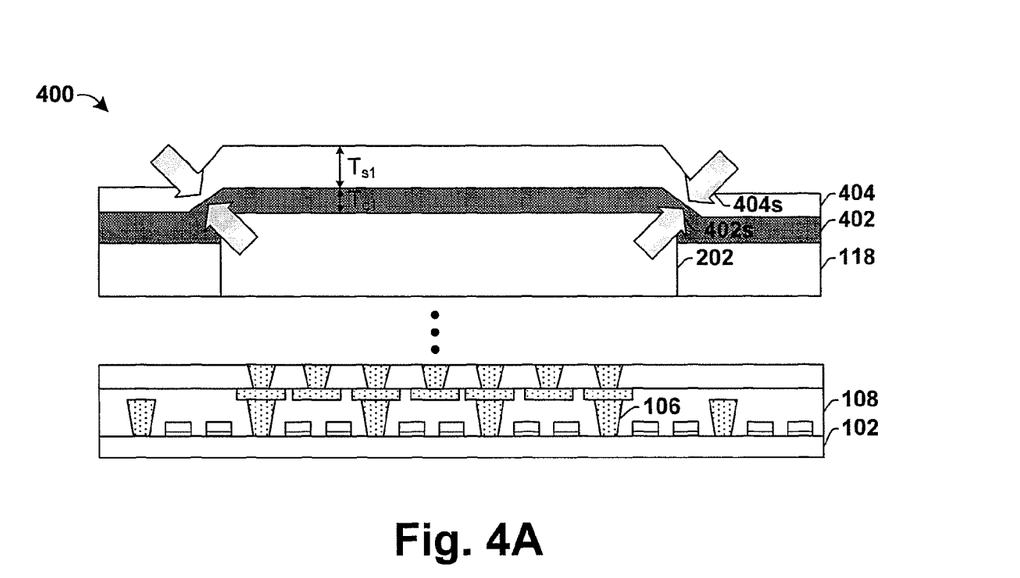
FIGS. 4A-4C illustrate various embodiments of cross-sectional views of integrated chips having one or more stress compensation layer configured to reduce stress on a protruding stressed element.
Figure 4B:
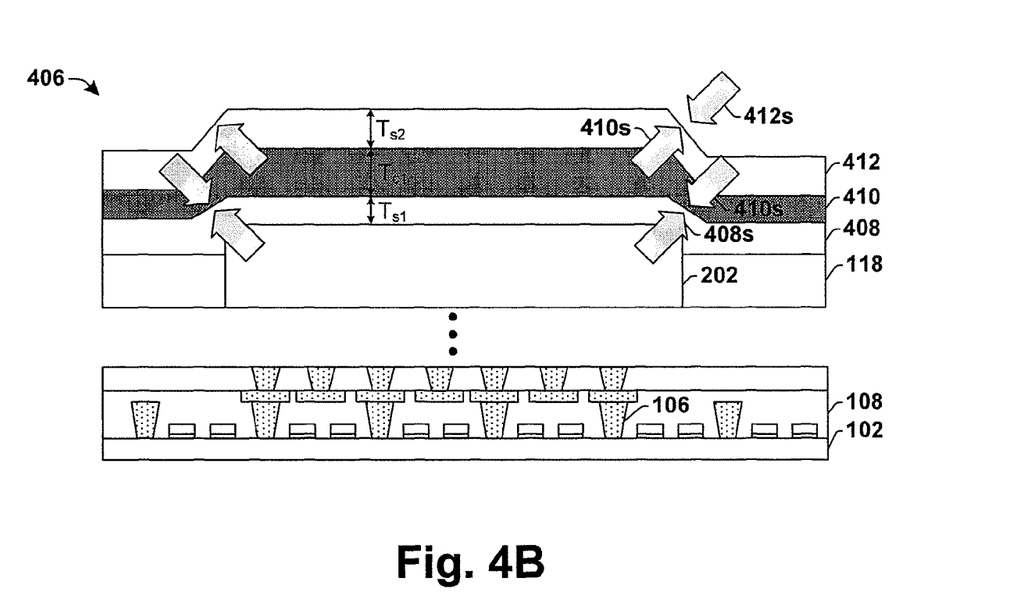
Figure 4C:
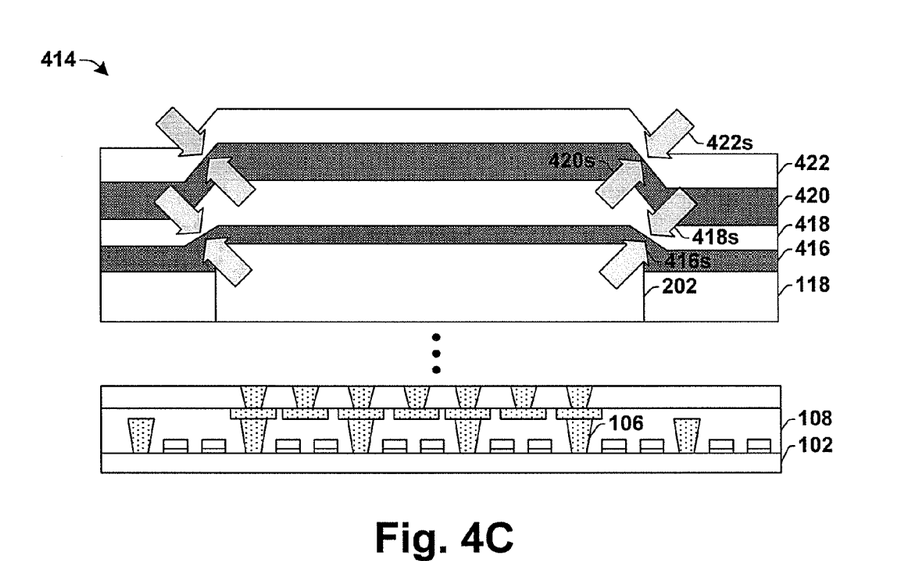

It will be appreciated that the disclosed integrated chip may any number of stress compensation layers, and that the stress compensation layers may be stacked in different configurations. FIGS. 4A-4C illustrate various embodiments of cross-sectional views of integrated chips having one or more stress compensation layers configured to reduce stress on a protruding stressed element.

FIG. 4A illustrates an integrated chip 400 having a stress compensation layer 402 disposed below a stressing layer 404.

The stress compensation layer 402 is disposed onto a protruding stressed element 202. The first stressing layer 404, configured to generate a stress 404s, is disposed onto the first stress compensation layer 402. The first stress compensation layer 402 is configured to generate a counter-stress 402s that reduces the stress 404s generated by the first stressing layer 404.

In some embodiments, the stress compensation layer 402 has a thickness of $T_{c1}$ and the stressing layer 404 has a thickness of $T_{s1}$. A ratio of the thicknesses of the stress compensation layer 402 and the stressing layer 404 ($T_{c1}/T_{s1}$) is in a range of between approximately 0.01 and approximately 2.

FIG. 4B illustrates an integrated chip 406 having a stress compensation layer 410 disposed between a lower stressing layer 408 and an upper stressing layer 412.

The lower stressing layer 408, configured to generate a first stress 408s, disposed onto a protruding stressed element 202. The stress compensation layer 410 is disposed onto the lower stressing layer 408. The upper stressing layer 412, configured to generate a second stress 412s, is disposed onto the stress compensation layer 410. The stress compensation layer 410 is configured to generate a counter stress 410s that reduces the first stress 408s and the second stress 412s generated by the lower and upper stressing layers, 408 and 412.

In some embodiments, the stress compensation layer 410 has a thickness of $T_{c1}$, the lower stressing layer 408 has a thickness of $T_{s1}$, and the upper stressing layer 412 has a thickness $T_{s2}$. In some embodiments, a ratio of the thicknesses of the stress compensation layer 410 and the upper stressing layer 412 and the lower stressing layer 408 ($T_{c1}/(T_{s1}+T_{s2})$) is in a range of between approximately 0.01 and approximately 2.

FIG. 4C illustrates an integrated chip 414 having a multiple stress compensation layers, 416 and 420.

A first stress compensation layer 416 is disposed onto a protruding stressed element 202. A first stressing layer 418, configured to generate a first stress 418s, is disposed onto the first stress compensation layer 416. The first stress compensation layer 416 is configured to generate a first counter-stress 416s that reduces the first stress 418s generated by the first stressing layer 418.

A second stress compensation layer 420 is disposed onto the first stressing layer 418. A second stressing layer 422, configured to generate a second stress 422s, is disposed onto the second stress compensation layer 420. The second stress compensation layer 420 is configured to generate a second counter-stress 420s that reduces the second stress 422s generated by the second stressing layer 422.

Figure 5:
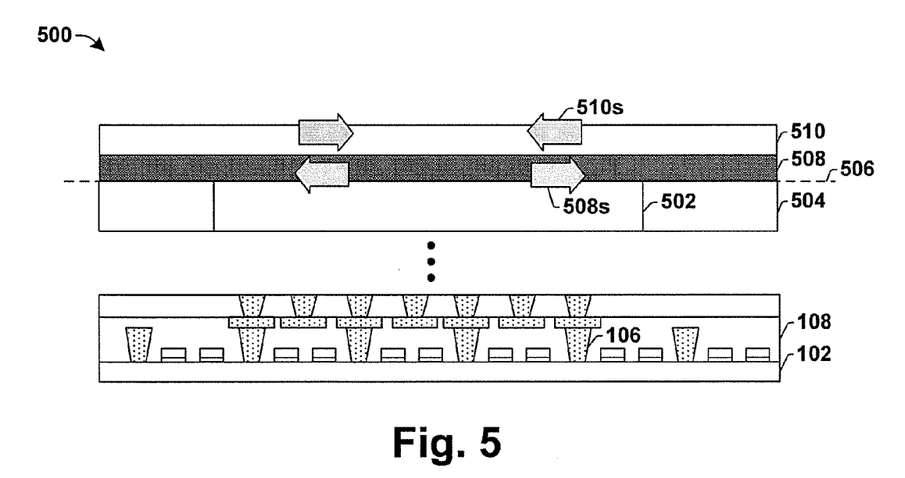
FIG. 5 illustrates a block diagram of some embodiments of an integrated chip having multiple stress compensation layers configured to reduce stress on a planar stressed element.

FIG. 5 illustrates a block diagram of some embodiments of an integrated chip 500 having multiple stress compensation layers configured to reduce stress on a planar stressed element 502.

Integrated chip 500 comprises a planar stressed element 502 and a surrounding dielectric material 504. The planar stressed element 502 has a top surface that is substantially planar (along planar surface 506) with a top surface of a surrounding dielectric material 118. A first stress compensation layer 508 is disposed onto the planar surface 506. A first stressing layer 510, configured to generate a stress 510s, is disposed onto the first stress compensation layer 508. The first stress compensation layer 508 is configured to provide a counter-stress 508s that reduces the stress 510s generated by the first stressing layer 510.

Figure 6:
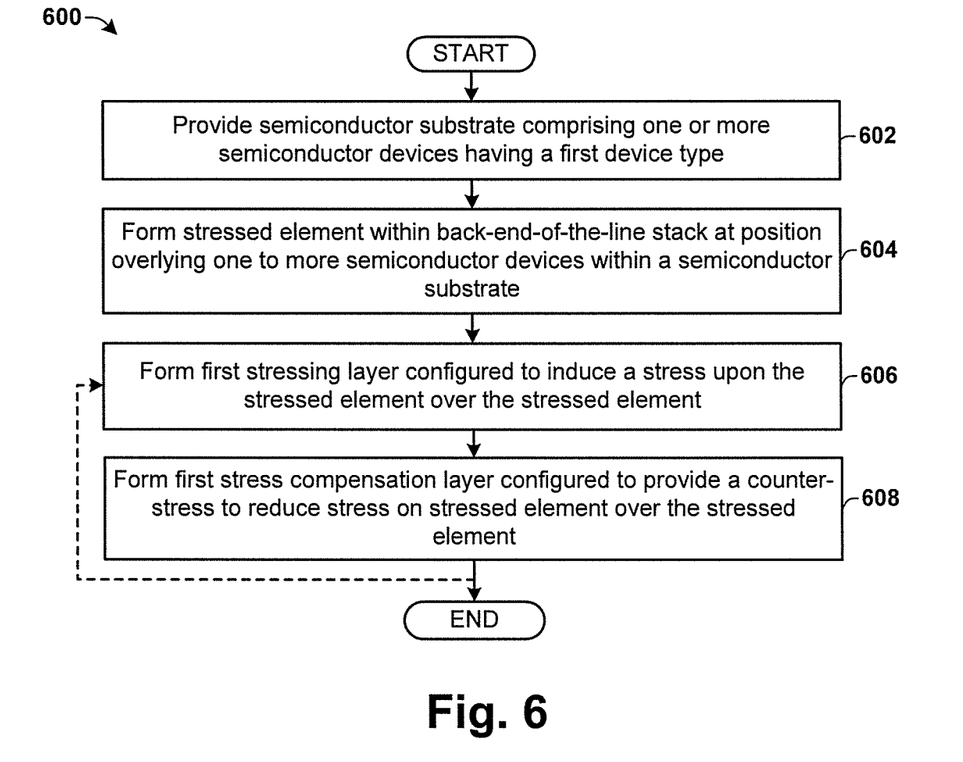
FIG. 6 illustrates a flow chart of some embodiments of a method of forming a back-end-of-the-line stress compensation layer configured to improve semiconductor device performance.

FIG. 6 illustrates a flow chart of some embodiments of a method 600 of forming a back-end-of-the-line stress compensation layer configured to improve semiconductor device performance.

While the disclosed method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, a semiconductor substrate is provided having one or more semiconductor devices. In some embodiments, the one or more semiconductor devices may comprise MOSFET devices formed within a front-end-of-the-line of an integrated chip. In other embodiments, the one or more semiconductor devices may comprise alternative transistor devices formed within a front-end-of-the-line of an integrated chip At 604, a stressed element is formed within a back-end-of-the-line metallization stack at position overlying the one to more semiconductor devices. The stressed element may be formed within a dielectric material (e.g., silicon dioxide) overlying one or more metallization layers. In some embodiments, the stressed element may be formed by depositing a metal (e.g., aluminum, copper, etc.) into a cavity in the dielectric material using a vapor deposition process (e.g., PVD, CVD, PECVD, etc.).

In some embodiments, the stressed element may comprise a wire bond pad and/or a redistribution layer. In other embodiments, the stressed element may comprise other structures, such as a dielectric film, for example.

At 606, a stressing layer is formed over the stressed element. The stressing layer may be formed by vapor deposition. The stressing layer is configured to generate a stress on the stressed element. In various embodiments, the stressing layer may comprise a passivation layer such as a silicon nitride (SIN) layer or an undoped silicate glass (USG) layer.

At 608, a stress compensation layer is formed over the stressed element. In some embodiments, the stress compensation layers may be formed at a position that is between the stressed element and the stressing layer. In other embodiments, the stress compensation layer may be formed at a position above the stressing layer. The stress compensation layer is configured to generate a counter-stress configured to reduce the stress generated by the stressing layer. In various embodiments, the stress compensation layer may be formed by a vapor deposition process (e.g., PVD, CVD, PECVD, etc.).

In some embodiments, the stress compensation layer may comprise a dielectric film. For example, the stress compensation layer may comprise a nitride layer comprising nitrogen, an oxide layer comprising oxygen, or an oxynitride layer comprising oxygen and nitrogen. In some embodiments, the stress compensation layer may further comprise a dopant, such as boride, which is introduced into the stress compensation layer during formation.

The stress provided by the stress compensation layer may be adjusted, to achieve stress values between approximately 500 MPa of tensile stress and approximately 500 MPa of compressive stress, by varying one or more process parameters of a deposition of the stress compensation layer. In some embodiments, the stress provided by the stress compensation layer may be varied by varying a temperature used during deposition of the stress compensation layer. For example, depositing a stress compensation layer at a first temperature will result in a stress compensation layer having a first stress value while depositing a stress compensation layer at a second temperature will result in a stress compensation layer having a second stress value different than the first stress value. In other embodiments, the stress provided by the stress compensation layer may be varied by varying a power used during a deposition, a gas flow rate, a gas flow combination (e.g., an amount of boride into a processing chamber), etc.

Acts 606 and 608 may be iteratively performed to form one or more stressing layers and/or stress compensation layers. For example, in some embodiments, a first stress compensation layer may be formed over the stressed element, a first stressing layer may be formed over the first stress compensation layer, a second stress compensation layer may be formed over the first stress compensation layer, and a first stressing layer may be formed over the second stress compensation layer.

By adding one or more stress compensation layers to a position above a stressed element within the back-end-of-the-line, stress is reduced on semiconductor devices in the front-end-of-the-line, thereby improving performance of the semiconductor devices.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to an integrated chip having one or more back-end-of-the-line stress compensation layers configured to reduce stress on an underlying semiconductor device, and an associated method of formation.

In some embodiments, the present disclosure relates to an integrated chip. The integrated chip comprises a stressed element located within a back-end-of-the-line stack disposed over a semiconductor substrate. The integrated chip further comprises a first stressing layer located over the stressed element and configured to induce a first stress upon the stressed element. The integrated chip further comprises a first stress compensation layer located over the stressed element and configured to provide a first counter-stress configured to reduce the first stress on the stressed element.

In other embodiments, the present disclosure relates to an integrated chip. The integrated chip comprises a semiconductor substrate comprising one or more semiconductor devices. The integrated chip further comprises a protruding stressed element located within a back-end-of-the line stack at a position overlying the one or more semiconductor devices, wherein the protruding stressed element protrudes from a dielectric material surrounding the protruding stressed element. The integrated chip further comprises a stressing layer located over the stressed element and configured to apply a stress upon the stressed element. The integrated chip further comprises a stress compensation layer disposed over the stressed element and configured to apply a counter-stress configured to reduce the stress on the stressed element.

In other embodiments, the present disclosure relates to a method of forming a back-end-of-the-line stress compensation layer to improve semiconductor device performance. The method comprises forming a stressed element within a back-end-of-the line stack at a position overlying one or more semiconductor devices in a semiconductor substrate. The method further comprises forming a stressing layer over the stressed element, wherein the stressing layer is configured to induce a stress upon the stressed element. The method further comprises forming a stress compensation layer over the stressed element, wherein the stress compensation layer is configured to provide a counter-stress configured to reduce the stress on the stressed element.

What is claimed is:

1. An integrated chip, comprising:
   a stressed element located within a back-end-of-the-line stack disposed over a semiconductor substrate;
   a first stressing layer located over the stressed element and configured to induce a first stress upon the stressed element;
   a first stress compensation layer located over the first stressing layer and configured to provide a first counter-stress configured to reduce the first stress on the stressed element; and
   a second stressing layer disposed over the first stress compensation layer and configured to induce a second stress upon the stressed element.

2. The integrated chip of claim 1, wherein the stressed element overlies one or more semiconductor devices located within the semiconductor substrate.

3. The integrated chip of claim 1, wherein the stressed element comprises a wire bond pad or a redistribution layer comprising aluminum, copper, or a combination thereof.

4. The integrated chip of claim 1, wherein the stressed element protrudes from a dielectric material surrounding the stressed element.

5. The integrated chip of claim 1, wherein the stressing layer comprises a silicon nitride (SIN) layer or an undoped silicate glass (USG) layer.

6. The integrated chip of claim 1, wherein the first stress compensation layer comprises nitrogen, oxygen, or a combination thereof.

7. The integrated chip of claim 1, further comprising:
a second stress compensation layer disposed between the stressed element and the second stressing layer and configured to provide a second counter-stress configured to reduce the second stress on the stressed element.

8. The integrated chip of claim 1, wherein a ratio of thickness between the first stress compensation layer and the first stressing layer is in a range of between approximately 0.01 and approximately 2.

9. An integrated chip, comprising:
a semiconductor substrate comprising one or more semiconductor devices;
a protruding stressed element located within a back-end-of-the line stack at a position overlying the one or more semiconductor devices, wherein the protruding stressed element protrudes from a dielectric material surrounding the protruding stressed element;
a stressing layer located over the stressed element and configured to apply a stress upon the stressed element;
a stress compensation layer disposed over the stressed element and configured to apply a counter-stress configured to reduce the stress on the stressed element; and
wherein the stressing layer and the stress compensation layer respectively have upper surfaces comprising protrusions overlying the protruding stressed element.

10. The integrated chip of claim 9, wherein the stressed element comprises a wire bond pad or a redistribution layer comprising aluminum, copper, or a combination thereof.

11. The integrated chip of claim 9,
wherein the protruding stressed element comprises a first portion, having a first height, which is embedded within a dielectric material surrounding the protruding stressed element, and a second portion, having a second height, which protrudes from the dielectric material,
wherein a ratio of the second height to the first height is in a range of between approximately 0 and approximately 3.

12. The integrated chip of claim 9, wherein the stressing layer comprises a silicon nitride (SIN) layer or an undoped silicate glass (USG) layer.

13. The integrated chip of claim 9, wherein the stress compensation layer comprises nitrogen, oxygen, or a combination thereof.

14. The integrated chip of claim 9, wherein the counter-stress has a value of between approximately 500 megapascals (MPa) of tensile stress and approximately 500 MPa of compressive stress.

15. The integrated chip of claim 9, further comprising:
a second stress compensation layer located over the stressed element and vertically separated from the stress compensation layer by the stressing layer.

16. The integrated chip of claim 9, further comprising:
a second stressing layer disposed between the stressed element and the stress compensation layer and configured to induce a second stress upon the stressed element; and
a second stress compensation layer disposed between the stressed element and the stress compensation layer and configured to provide a second counter-stress configured to reduce the second stress on the stressed element.

17. A method of forming a back-end-of-the-line stress compensation layer to improve semiconductor device performance, comprising:
forming a stressed element within a back-end-of-the line stack at a position overlying one or more semiconductor devices in a semiconductor substrate;
forming a stressing layer over the stressed element, wherein the stressing layer is configured to induce a stress upon the stressed element;
forming a stress compensation layer over the stressed element, wherein the stress compensation layer is configured to provide a counter-stress configured to reduce the stress on the stressed element;
forming a second stressing layer disposed between the stressed element and stress compensation layer and configured to induce a second stress upon the stressed element; and
forming a second stress compensation layer disposed between the stressed element and the second stressing layer and configured to provide a second counter-stress configured to reduce the second stress on the stressed element.

18. The method of claim 17, wherein the stressed element comprises a wire bond pad or a redistribution layer comprising aluminum, copper, or a combination thereof.

19. The method of claim 17, wherein the stressed element protrudes from a dielectric material surrounding the stressed element.

20. The method of claim 17, wherein the stress compensation layer comprises nitrogen, oxygen, or a combination thereof.

* * * * *